(12) United States Patent
Ali et al.

(10) Patent No.: US 11,852,957 B2
(45) Date of Patent: Dec. 26, 2023

(54) THERMAL-CONTROL SYSTEM FOR A SECURITY CAMERA AND ASSOCIATED SECURITY CAMERA

(71) Applicant: Google LLC, Mountain View, CA (US)

(72) Inventors: Ihab A. Ali, Cupertino, CA (US); Arun Prakash Raghupathy, Pleasanton, CA (US); Mark Benjamin Kraz, Santa Clara, CA (US); Kok Yen Cheng, San Jose, CA (US); Chi-Ming Lin, New Taipei (TW)

(73) Assignee: Google LLC, Mountain View, CA (US)

( * ) Notice: Subject to any disclaimer, the term of this patent is extended or adjusted under 35 U.S.C. 154(b) by 387 days.

(21) Appl. No.: 17/028,456

(22) Filed: Sep. 22, 2020

(65) Prior Publication Data

US 2022/0091484 A1 Mar. 24, 2022

(51) Int. Cl.
| | |
|---|---|
| *G03B 17/55* | (2021.01) |
| *G08B 13/196* | (2006.01) |
| *H05K 7/20* | (2006.01) |
| *H04N 23/52* | (2023.01) |
| *H04N 23/51* | (2023.01) |

(52) U.S. Cl.
CPC ....... *G03B 17/55* (2013.01); *G08B 13/19619* (2013.01); *H04N 23/52* (2023.01); *H05K 7/20472* (2013.01); *H05K 7/20509* (2013.01); *H04N 23/51* (2023.01); *H05K 7/20454* (2013.01)

(58) Field of Classification Search
CPC .......... H05K 7/20454; H05K 7/20509; H05K 7/20472; H01L 23/3737; G03B 17/55; H04N 23/51; H04N 23/52; G08B 13/19619
See application file for complete search history.

(56) References Cited

U.S. PATENT DOCUMENTS

| | | | |
|---|---|---|---|
| 5,403,782 A | 4/1995 | Dixon et al. | |
| 8,081,468 B2 | 12/2011 | Hill et al. | |
| 9,661,235 B2 * | 5/2017 | Petty | H04N 23/57 |
| 9,848,517 B2 | 12/2017 | Koeppel et al. | |

(Continued)

FOREIGN PATENT DOCUMENTS

| | | |
|---|---|---|
| CN | 103269414 | 8/2013 |
| CN | 106534809 | 3/2017 |

(Continued)

OTHER PUBLICATIONS

"Extended European Search Report", EP Application No. 21193113.4, dated Feb. 4, 2022, 10 pages.

(Continued)

*Primary Examiner* — Zachary Pape
(74) *Attorney, Agent, or Firm* — Colby Nipper PLLC

(57) ABSTRACT

This document describes a thermal-control system that is integrated into a security camera. The thermal-control system includes a combination of heatsinks and thermal interface materials with high thermal conductivities. The thermal-control system may transfer and spread energy from a high thermal-loading condition effectuated upon the security camera to concurrently maintain temperatures of multiple thermal zones on or within the security camera at or below prescribed temperature thresholds.

13 Claims, 5 Drawing Sheets

(56) References Cited

U.S. PATENT DOCUMENTS

| | | | |
|---|---|---|---|
| 10,319,213 B1 | 6/2019 | Conner | |
| 10,418,672 B2 | 9/2019 | Tso et al. | |
| 10,708,472 B2 | 7/2020 | Jeong et al. | |
| 10,718,996 B2 | 7/2020 | Ramones et al. | |
| 10,795,242 B2 * | 10/2020 | Chan | G05D 1/02 |
| 11,277,941 B1 | 3/2022 | Raghupathy et al. | |
| 11,457,545 B2 | 9/2022 | Heckmann et al. | |
| 11,659,677 B2 * | 5/2023 | Kwan | G03B 17/561 |
| | | | 348/373 |
| 2011/0149533 A1 | 6/2011 | Luo et al. | |
| 2014/0253728 A1 | 9/2014 | Glockler | |
| 2016/0043453 A1 | 2/2016 | Ebner et al. | |
| 2016/0157333 A1 | 6/2016 | Kim et al. | |
| 2016/0189502 A1 | 6/2016 | Johnson et al. | |
| 2016/0191864 A1 | 6/2016 | Siminoff et al. | |
| 2017/0339343 A1 | 11/2017 | Zhang et al. | |
| 2018/0011390 A1 * | 1/2018 | Goulden | H04N 23/51 |
| 2018/0013272 A1 | 1/2018 | Germe et al. | |
| 2018/0143671 A1 | 5/2018 | Lee et al. | |
| 2018/0191930 A1 | 7/2018 | Jeong et al. | |
| 2019/0089872 A1 * | 3/2019 | Rukes | G08B 13/19626 |
| 2019/0215423 A1 | 7/2019 | Ortiz et al. | |
| 2019/0230259 A1 | 7/2019 | Germe et al. | |
| 2019/0373314 A1 | 12/2019 | Collins et al. | |
| 2020/0241396 A1 | 7/2020 | Park et al. | |
| 2022/0110228 A1 | 4/2022 | Raghupathy et al. | |
| 2022/0159877 A1 | 5/2022 | Raghupathy et al. | |
| 2023/0031426 A1 | 2/2023 | Kraz et al. | |

FOREIGN PATENT DOCUMENTS

| | | |
|---|---|---|
| CN | 106791337 | 5/2017 |
| CN | 206629176 | 11/2017 |
| CN | 107995393 | 5/2018 |
| CN | 109862329 | 6/2019 |
| CN | 110891135 | 3/2020 |
| CN | 210958525 | 7/2020 |
| CN | 212463322 | 2/2021 |
| JP | 2010261801 | 11/2010 |
| JP | 5408890 | 2/2014 |
| KR | 20180019449 | 2/2018 |
| TW | 201044866 | 12/2010 |
| TW | T202115457 | 4/2021 |
| WO | 2021021918 | 2/2021 |
| WO | 2022066287 | 3/2022 |
| WO | 2023277933 | 1/2023 |

OTHER PUBLICATIONS

"International Search Report and Written Opinion", Application No. PCT/US2021/044197, dated Apr. 4, 2022, 11 pages.

Orsan, "What's Inside?—vol. 2: Dropcam Pro", Accessed on Apr. 21, 2020 from https://medium.com/@candemir/whats-inside-vol-2-dropcam-pro-f458d96ecc9a, Dec. 21, 2014.

"Foreign Office Action", TW Application No. 110141071, dated Sep. 7, 2022, 16 pages.

"Ex Parte Quayle Action", U.S. Appl. No. 17/061,872, filed Sep. 16, 2021, 9 pages.

"International Search Report and Written Opinion", Application No. PCT/US2021/044194, dated Dec. 7, 2021, 12 pages.

"Notice of Allowance", U.S. Appl. No. 17/061,872, filed Dec. 13, 2021, 6 pages.

"Foreign Office Action", TW Application No. 110141071, dated Apr. 11, 2022, 7 pages.

"International Preliminary Report on Patentability", Application No. PCT/US2021/044194, dated Mar. 28, 2023, 9 pages.

"Non-Final Office Action", U.S. Appl. No. 17/649,529, filed Apr. 13, 2023, 21 pages.

"International Preliminary Report on Patentability", Application No. PCT/US2021/044197, dated Jan. 31, 2023, 8 pages.

"Notice of Allowance", U.S. Appl. No. 17/649,529, dated Jul. 28, 2023, 9 pages.

"Foreign Office Action", TW Application No. 110141071, dated Oct. 2, 2023, 9 pages.

* cited by examiner

THERMAL-CONTROL SYSTEM FOR A SECURITY CAMERA AND ASSOCIATED SECURITY CAMERA

BACKGROUND

Security cameras are becoming a popular addition to home security systems. A security camera may be battery-powered and include multiple integrated circuit (IC) devices, such as a passive infrared (PIR) sensor IC device that detects motion and an image sensor IC device that captures images. The security camera may also include a system-on-chip (SoC) IC device that executes a machine-learning algorithm.

The security camera may, in some instances, include a thermal-control system fabricated using a stamped sheet metal structure that can dissipate heat from the SoC IC device during a low thermal-loading condition, such as when the security camera is operating in an event-based recording (EBR) mode that is triggered by a motion detected through the PIR sensor IC device. In such instances, the SoC IC device may dissipate heat at a rate of up to 2.5 Watts (W) for several seconds. In such an instance, the thermal-control system may be capable of dissipating the heat from the low thermal-loading condition to maintain a single prescribed temperature threshold across the multiple IC devices, effectively treating the security camera as a single thermal zone.

However, under a high thermal-loading condition, such as when the security camera is operating in a continuous video recording (CVR) mode, the SoC IC device may dissipate heat at a rate of up to 2.5 W continually. Additionally, if the security camera is exposed to solar radiation, the high thermal-loading condition on the security camera may increase even further (e.g., increase further beyond 2.5 W). In such an instance, the thermal-control system may be inadequate to maintain the single prescribed temperature threshold across the multiple IC devices. The inability of the thermal-control system to dissipate heat from the security camera may result in (i) damage to one or more IC devices of the security camera and/or (ii) a housing of the security camera exceeding a prescribed ergonomic touch-temperature threshold.

SUMMARY

This document describes a thermal-control system that is integrated into a security camera. The thermal-control system includes a combination of heatsinks and thermal interface materials (TIMs) with high thermal conductivities. The thermal-control system may transfer and spread energy from a high thermal-loading condition effectuated upon the security camera to concurrently maintain temperatures of multiple thermal zones on or within the security camera at or below prescribed temperature thresholds.

In some aspects, a thermal-control system for a security camera is described. The thermal-control system includes a first thermal-control subsystem that is configured to transfer a first quantity of heat to a housing. The first thermal-control subsystem includes a first TIM that is located between an SoC IC device and a first heat sink, where the SoC IC device is mounted to a first surface of a first printed circuit board (PCB). The first thermal-control subsystem also includes a second TIM that is located between a memory IC device, such as a double-data rate (DDR) memory IC device, and the first heat sink. The memory IC device, like the SoC IC device, is mounted to the first surface of the PCB. The first thermal-control subsystem also includes a third TIM that is located between a second surface of the first PCB and a second heat sink, where the second surface of the first PCB is opposite the first surface of the first PCB.

The thermal-control system for the security camera, as described, also includes a second thermal-control subsystem that is configured to transfer a second quantity of heat to the housing. The second thermal-control subsystem includes a fourth TIM that is located between a second surface of a second PCB and a heat spreader. The second surface of the second PCB is opposite a first surface of the second PCB to which a passive infrared sensor IC device and an image sensor IC device are mounted.

In some other aspects, a security camera is described. The security camera includes an SoC IC device mounted to a surface of a PCB, a memory IC device mounted to the surface of the PCB, and a battery. The security camera also includes a thermal-control system configured to concurrently maintain temperatures through the security camera during a high thermal-loading condition. The thermal-control system is configured to concurrently maintain (i) a first temperature of a first thermal zone that includes the SoC IC device at or below a first prescribed temperature threshold, (ii) a second temperature of a second thermal zone that includes the memory IC device at or below a second prescribed temperature threshold, and (iii) a third temperature of a third thermal zone that includes the battery at or below a third prescribed temperature threshold.

The details of one or more implementations are set forth in the accompanying drawings and the following description. Other features and advantages will be apparent from the description, the drawings, and the claims. This summary is provided to introduce subject matter that is further described in the Detailed Description. Accordingly, a reader should not consider the summary to describe essential features nor threshold the scope of the claimed subject matter.

BRIEF DESCRIPTION OF THE DRAWINGS

The details of one or more aspects of a thermal-control system for a security camera are described below. The use of the same reference numbers in different instances in the description and the figures indicate similar mechanisms.

DETAILED DESCRIPTION

Figure 1:
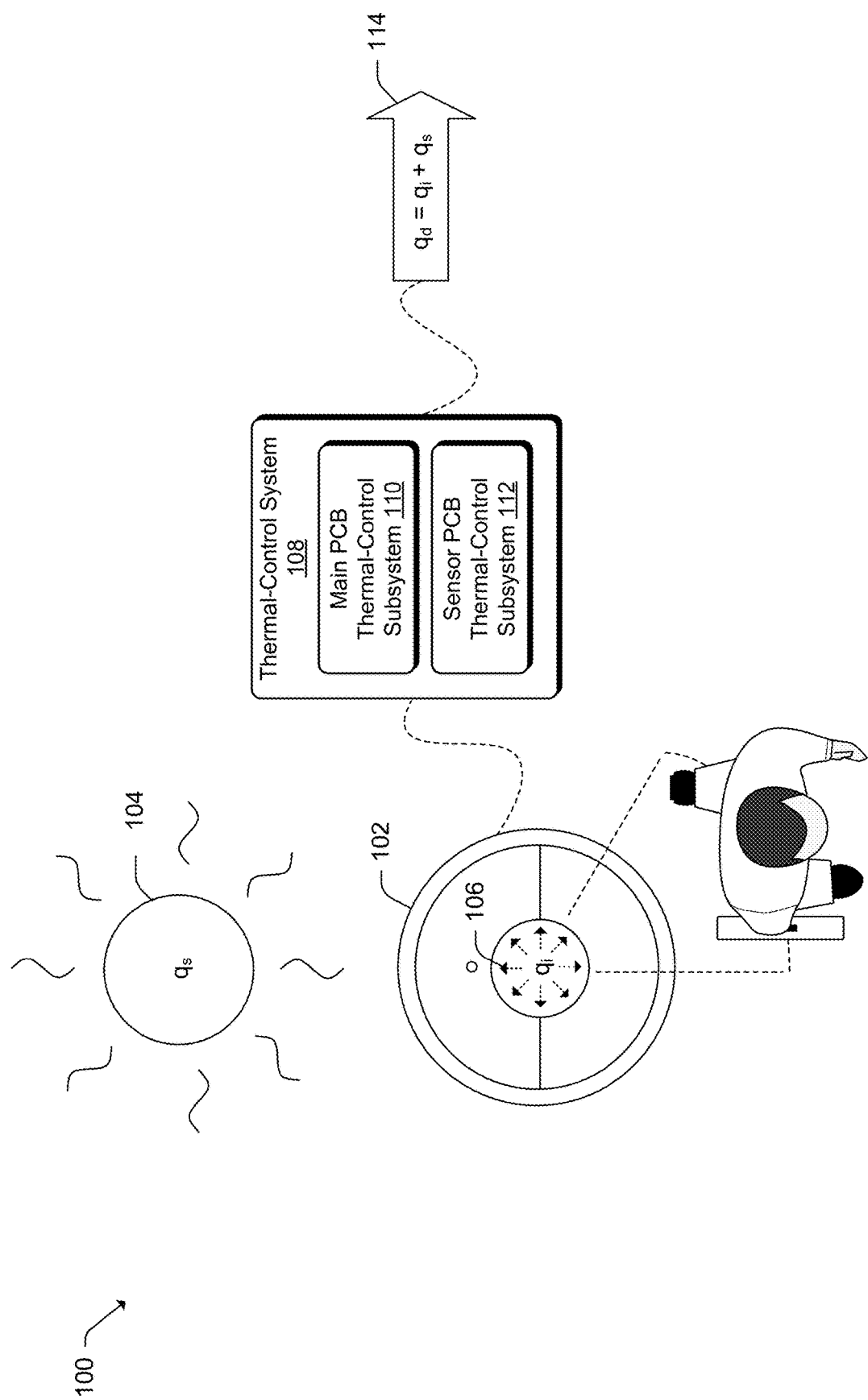
FIG. 1 illustrates an example operating environment in which a thermal-control system for a security camera can be implemented.

This document describes a thermal-control system that is integrated into a security camera. The thermal-control system includes a combination of heatsinks and thermal interface materials (TIMs) with high thermal conductivities. The thermal-control system may transfer and spread energy from a high thermal-loading condition effectuated upon the security camera to concurrently maintain temperatures of multiple thermal zones on or within the security camera at or below prescribed temperature thresholds.

While features and concepts of the described thermal-control system can be implemented in any number of different environments and devices, aspects are described in the context of the descriptions and examples below.

Heat transfer, in general, is energy that is in transit due to a temperature difference. If one or more temperature differences exist across components of a system, such as the security camera, heat (e.g., energy in Joules) will transfer from higher temperature zones to lower temperature zones to minimize the temperature differences. There are several mechanisms for heat transfer across the components of a system to minimize temperature differences, including convection, radiation, and conduction.

Convection, or heat transfer from a surface due to movement of molecules within fluids such as gases and liquids, can be quantified by equation (1) below:

$$q_{conv} = hA(T_s - T_\infty) \quad (1)$$

For equation (1), $q_{conv}$ represents a rate of heat transfer from a surface through convection (e.g., in Joules per second or Watts (W)), h represents a convection heat transfer coefficient (e.g., in W per meter squared (W/m²)), $T_s$ represents a temperature of a surface (e.g., in Kelvin (K) or degrees Celsius (° C.)), and $T_\infty$ represents a temperature of a fluid (e.g., in K or ° C.) to which the surface is exposed. The term A represents the area of a surface (e.g., in m²).

Radiation, or heat transfer from a surface through electromagnetic radiation, can be quantified by equation (2) below:

$$q_{rad} = \varepsilon A \sigma (T_s^4 - T_{surr}^4) \quad (2)$$

For equation (2), $q_{rad}$ represents a rate of heat transfer through radiation (e.g., in W), ε represents emissivity (dimensionless), σ represents the Stefen-Boltzmann constant (e.g., σ=5.67×10⁻⁸ W/(m²·K⁴)), $T_s$ represents a temperature of a surface (e.g., in K or ° C.), and $T_{surr}$ represents a temperature of surroundings of the surface (e.g., in K or ° C.). The term A represents an area of the surface (e.g., in m²).

Conduction, or heat transfer through a solid body through atomic and molecular activity, can be quantified by equation (3) below:

$$q_{cond} = -kA \frac{dT}{dx} \quad (3)$$

For equation (3), $q_{cond}$ represents a rate of heat transfer in a solid material through conduction (e.g., in W), k represents a thermal conductivity of the solid material (e.g., in W/(m·K)), and dT/dx represents a temperature gradient through the solid material (e.g., in K/m or ° C./m). The term A represents a cross-sectional area of the solid material (e.g., in m²).

For a security camera, heat transfer between components may occur using one or more of the heat transfer mechanisms described above. In general, and in accordance with equations (1) and (2), heat transfer can be varied by increasing or decreasing surface areas for convection and/or radiation within the security camera (e.g., increasing or decreasing surface areas of heat sinks and/or heat spreading mechanisms).

Furthermore, and in accordance with equation (3), heat transfer can be varied by choosing one or more TIMs having specific thermal conductivities. Through careful design of heat sinks and the use of TIMs having the specific thermal conductivities, a thermal-control system of the security camera can concurrently maintain temperatures of different thermal zones at or below different prescribed temperature thresholds during a high thermal-loading condition.

FIG. 1 illustrates an example operating environment 100 in which a thermal-control system for a security camera can be implemented. In the operating environment 100, a solar source (e.g., the sun) is radiating a solar heat load 104 (e.g., $q_s$) onto at least one exterior surface of the security camera 102. Also, in the operating environment 100, at least one electronic device (e.g., at least one IC device) is generating an internal heat load 106 (e.g., $q_i$) within the security camera 102. The operating environment 100 may include a 1000 W/m² solar heat load 104 and a 2.5 W internal heat load 106.

As will be described in greater detail in figures below, the security camera 102 includes a thermal-control system 108. The thermal-control system 108 may include one or more thermal-control subsystems. For instance, the thermal-control system 108 may include a main PCB thermal-control subsystem 110 having heat transfer mechanisms that contribute to transferring heat from a main PCB populated with an SoC IC device and one or more memory IC devices to a housing of the security camera 102. The thermal-control system 108 may also include a sensor PCB thermal-control subsystem 112 having other heat transfer mechanisms that contribute to transferring heat from a sensor PCB populated with a PIR sensor IC device and an image sensor IC device to the housing of the security camera.

The thermal-control system 108 may effectuate transfer of heat (e.g., the solar heat load 104 plus the internal heat load 106 as realized by the security camera 102) for heat dissipation 114 (e.g., $q_d$) to the operating environment 100. In some instances, the thermal-control system may also concurrently maintain temperatures of multiple thermal zones within the security camera 102 at or below multiple, different prescribed temperature thresholds.

Figure 2:
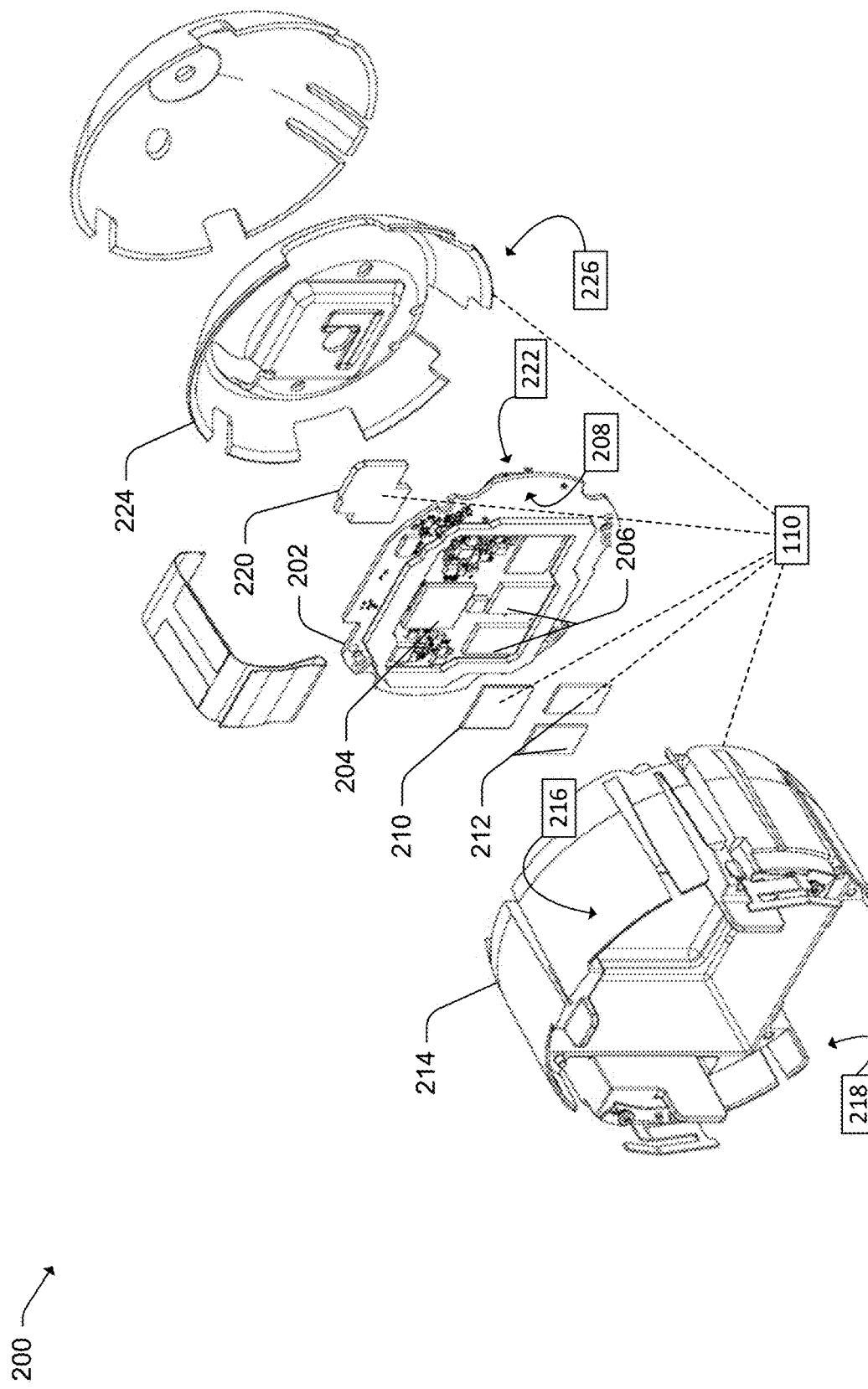
FIG. 2 illustrates a magnified, exploded view of an assembly including a main PCB thermal-control subsystem.

FIG. 2 illustrates a magnified, exploded view 200 of an assembly including the main PCB thermal-control subsystem 110 of FIG. 1. As illustrated, the assembly includes a main PCB 202 that is populated with an SoC IC device 204 and one or more memory IC device(s) 206, such as one or more DDR memory IC devices.

The SoC IC device 204 and the one or more memory IC device(s) 206 are mounted to a first surface 208 of the main PCB 202. The SoC IC device 204 and the one or more memory IC device(s) 206 may be mounted to the first surface 208 of the main PCB 202 using surface mount (SMT) techniques that include soldering leads of the respective devices to electrical interconnect pads on the main PCB 202 and/or underfilling. The main PCB 202, in some instances, may be a multi-layer PCB that includes multiple layers of electrical traces separated by multiple, corresponding layers of one or more dielectric materials.

FIG. 2 also illustrates details of the main PCB thermal-control subsystem 110. The main PCB thermal-control subsystem 110 includes a first TIM 210 (e.g., an SoC IC device topside TIM), second TIM(s) 212 (e.g., memory IC device topside TIM(s)), and a first heat sink 214 (e.g., a front heat sink). The first TIM 210 and the second TIM(s) 212 may be located between, and serve as a thermal conduction path between, the first heat sink 214 and respective surfaces (e.g., respective topside surfaces) of the SoC IC device 204 and the memory IC device(s) 206.

The first heat sink 214 may be die-cast and include, for example, an aluminum material such as AL1100. Furthermore, the first heat sink 214 may be positioned such that a perimeter surface 216 (e.g., an exterior surface) of the first heat sink 214 is in direct physical and thermal contact with a housing (e.g., an interior surface of a housing component of the security camera 102 of FIG. 1). The first heat sink 214 may also include one or more flange(s) 218 configured for multiple uses. For instance, the one or more flange(s) 218 may act as alignment guides to insert and assemble the first heat sink 214 into a housing of a security camera. By aligning the surfaces (e.g., the perimeter surface 216 to an interior surface of the housing), the one or more flange(s) 218 may improve heat transfer (e.g., thermal conduction) between the first heat sink 214 and the housing. Furthermore, the one or more flange(s) 218 may provide additional surface area to conduct additional heat to the housing.

Although the first heat sink 214 is illustrated as generally cylindrical in shape (e.g., having a generally round or oval cross-section), other shapes are possible. For instance, if a housing of a security camera including the first heat sink were of a cuboid shape, the first heat sink 214 could have a square or rectangular cross-section.

A third TIM 220 (e.g., an SoC IC device backside TIM), as illustrated in FIG. 2, is located between a second surface 222 of the main PCB 202 and a second heat sink 224 (e.g., a rear heat sink) having a generally concave shape. The third TIM 220 serves as a thermal conduction path between the second surface 222 of the main PCB 202 and the second heat sink 224.

The main PCB thermal-control subsystem 110 may include different combinations of materials. For example, the first TIM 210 and the second TIM(s) 212 may be made up of a gel material with a high thermal conductivity (measured in W/(m·K)) and include a silicone-rubber material injected with nanoparticles such as aluminum, beryllium-nitride, and so on. As another example, the third TIM 220 may include a thermal pad material. Examples of the thermal pad material include a preformed solid material that is silicone-based or paraffin wax-based.

In some instances, the second heat sink 224 may be a stamped heat sink formed using an aluminum-alloy material, such as AL1100. The second heat sink 224 may include one or more flange(s) 226 and/or bends that form a cavity or recessed area within the second heat sink 224 to receive and support the main PCB 202 (e.g., an outline or shape of the main PCB 202). When assembled, the one or more flange(s) 226 may include a lip or a rib along an outer rim, which may enable the second heat sink 224 to be secured to (e.g., clip to) the first heat sink 214, thereby forming a cavity to house the main PCB 202. Furthermore, and in some instances, the one or more flange(s) 226 may contribute to improvements in performance of the main PCB thermal-control subsystem 110 by aligning surfaces for heat transfer (e.g., thermal conduction) between the second heat sink 224 and a housing (e.g., an interior surface of a housing component of the security camera 102 of FIG. 1). Furthermore, the one or more flange(s) 226 may provide additional surface area to conduct additional heat to the housing.

In general, the main PCB thermal-control subsystem 110, as detailed in FIG. 2, includes TIMs (e.g., the first TIM 210, the second TIM(s) 212, and the third TIM 220) having high thermal conductivity (e.g., thermal gels and/or thermal pads) to transfer heat generated by the SoC IC device 204 and/or the memory IC device(s) 206. The main PCB thermal-control subsystem 110 transfers the heat using two different paths that include heat sinks with high thermal conductive properties (e.g., a first path that includes the first heat sink 214 and a second path that includes the second heat sink 224). The main PCB thermal-control subsystem 110, in general, may contribute to maintaining multiple thermal zones of a security camera at or below respective, prescribed temperature thresholds.

Figure 3:
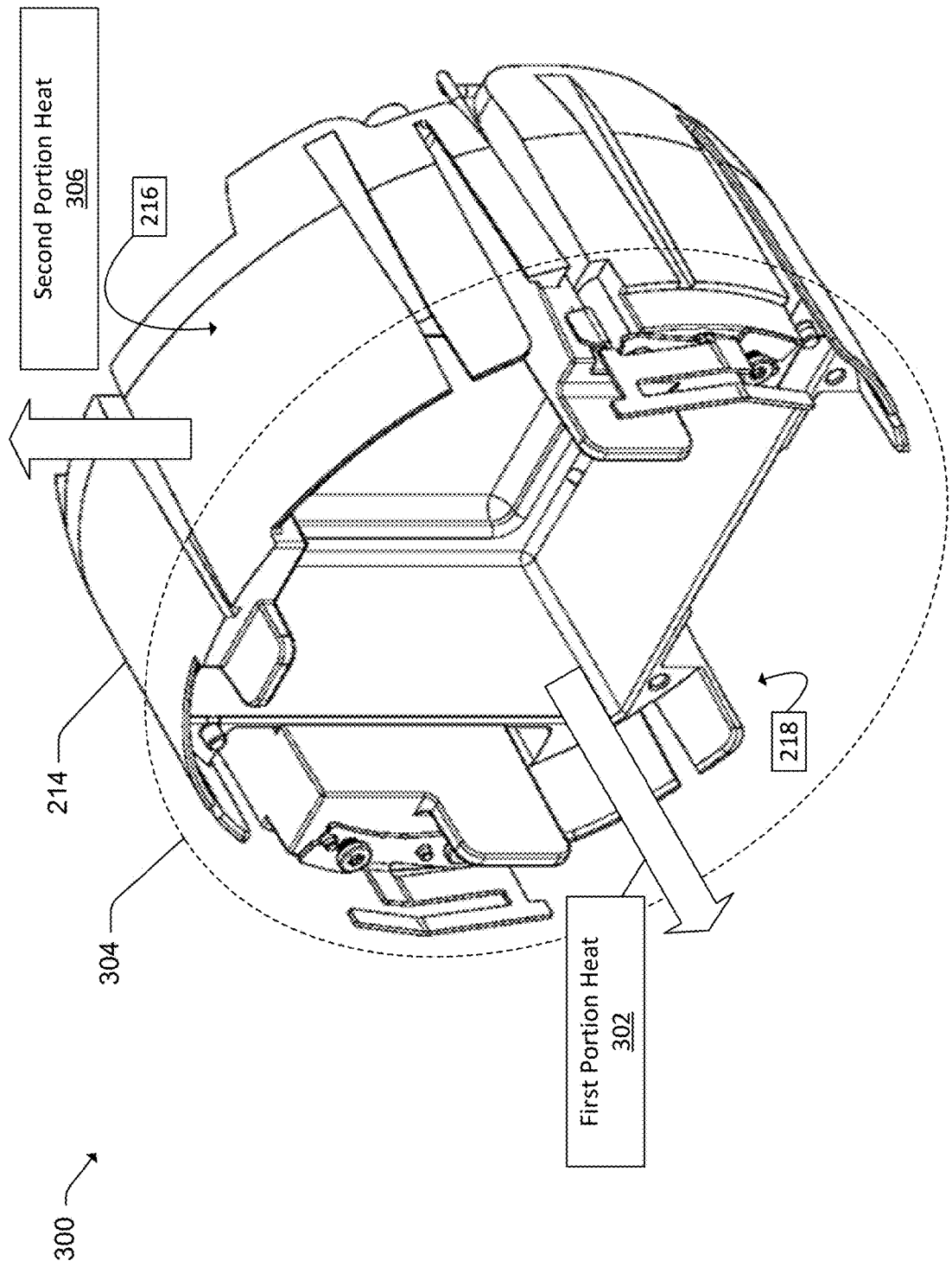
FIG. 3 illustrates example details of heat flow distribution through a heat sink within a main PCB thermal-control subsystem.

FIG. 3 illustrates example details 300 of heat flow distribution through the first heat sink 214 of FIG. 2.

As illustrated, the first heat sink 214 may have a generally cylindrical shape. An area of the perimeter surface 216 of the first heat sink 214 may be sized for a specific heat transfer performance. As an example, the area of the perimeter surface 216 may be sized to transfer a first portion 302 of heat through a front region 304 of the first heat sink 214 and a second portion 306 through the perimeter surface 216. In such an instance, the first portion 302 may be transferred using a convection and/or radiation heat transfer mechanism, while the second portion 306 may be transferred using a conduction heat transfer mechanism.

As an example, heat transfer may include the first portion 302 being 65% of a heat load and the second portion 306 being 35% of the heat load. The surface area of the perimeter surface 216 may be sized to maintain a temperature of a thermal zone within a prescribed temperature threshold while a combined heat load (e.g., the solar heat load 104 and the internal heat load 106 of FIG. 1) is exuded upon a security camera that includes the first heat sink 214.

Note that for different instances, distribution (e.g., portions of heat) and direction of heat flow through the first heat sink 214 may vary. Such different instances may include, for example, different magnitudes of heat loads (e.g., different magnitudes of the solar heat load 104 and the internal heat load 106) as well as different ambient conditions surrounding a home-security camera including the first heat sink 214.

In some instances, different sizes (e.g., respective surface areas) of the one more flange(s) 218 may alter or change respective magnitudes of the first portion 302 of the heat and the second portion 306 of the heat. Furthermore, respective locations of the one or more flange(s) 218 may impact respective magnitudes of the first portion 302 of the heat and the second portion 306 of the heat. The one or more flange(s) 218 may transfer heat using thermal conduction, thermal convection, and/or thermal radiation heat transfer mechanisms.

Figure 4:
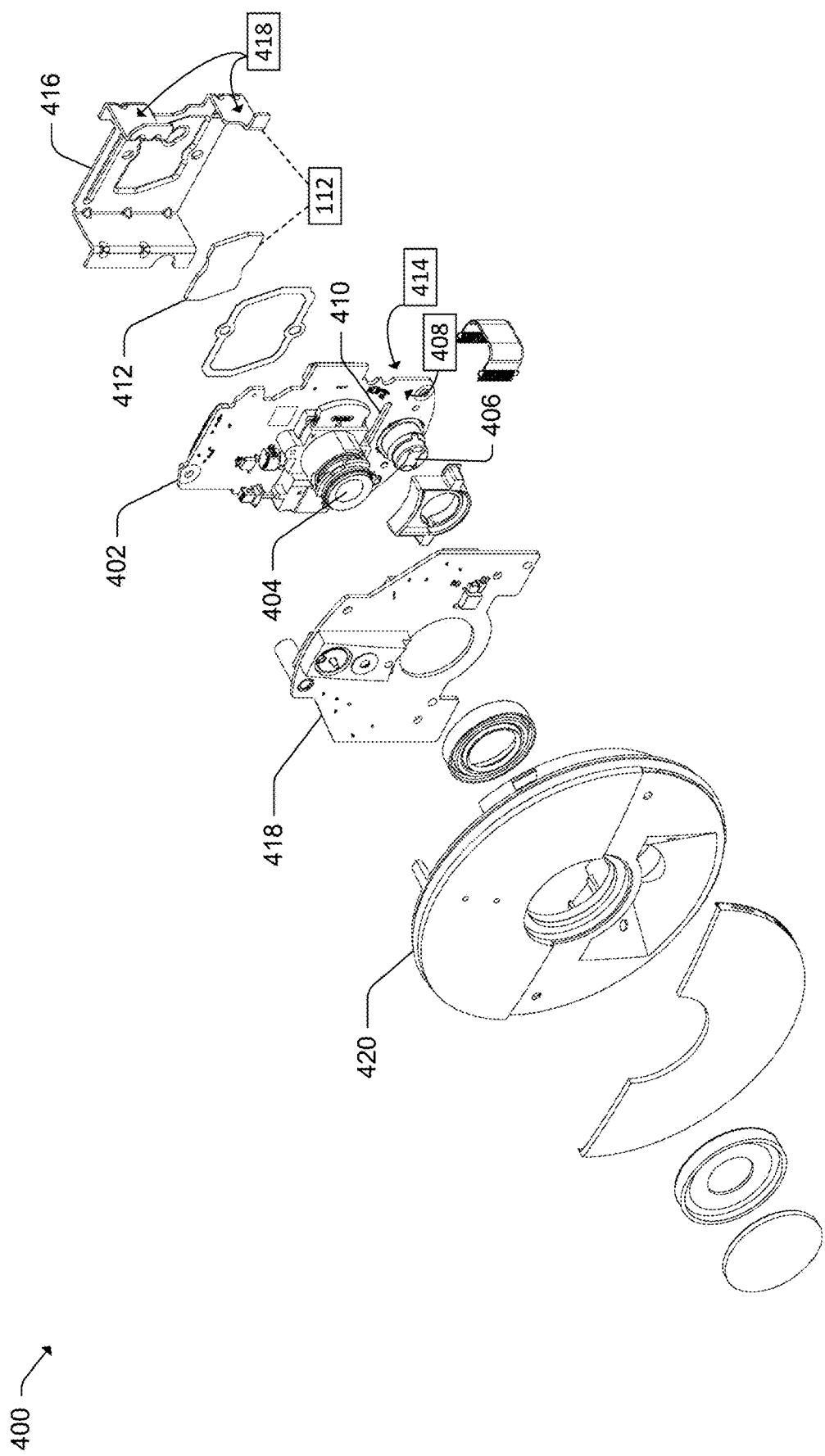
FIG. 4 illustrates a magnified, exploded view of an assembly including a sensor PCB thermal-control subsystem.

FIG. 4 illustrates a magnified, exploded view 400 of an assembly including the sensor PCB thermal-control subsystem 112 of FIG. 1. As illustrated, the assembly includes a sensor PCB 402 that is populated with an image sensor IC device 404 and a PIR sensor IC device 406.

The image sensor IC device 404 and the PIR sensor IC device 406 are mounted to a first surface 408 of the sensor PCB 402. The image sensor IC device 404 and the PIR sensor IC device 406 may be mounted to the first surface 408 of the sensor PCB 402 using SMT techniques that include soldering leads of the respective devices to electrical interconnect pads on the sensor PCB 402 and underfilling.

The sensor PCB 402, in some instances, may be a multi-layer PCB that includes multiple layers of electrical traces separated by multiple, corresponding layers of one or more dielectric materials. The sensor PCB 402 may be further enhanced with separate, respective ground planes for the image sensor IC device 404 and the PIR sensor IC device 406.

The respective ground planes may be thermally separated by a slot 410 in the sensor PCB 402 that reduces heat transfer between the image sensor IC device 404 and the PIR sensor IC device 406. In some instances, the slot 410 may have a length that is an order of magnitude greater than a width of the slot (e.g., the length of the slot 410 may be 10× the width of the slot 410) so that thermal separation (e.g., thermal resistance) is increased. Furthermore, the respective ground planes of the image sensor IC device 404 and the PIR sensor IC device 406 may be formed from a material that has a high thermal conductivity (e.g., a copper material).

FIG. 4 also illustrates a fourth TIM 412. The fourth TIM 412 may be located between a second surface 414 of the sensor PCB 402 (e.g., the second surface 414 that is opposite from the first surface 408 of the sensor PCB 402) and serve as a thermal conduction path between the second surface 414 of the sensor PCB 402 and a heat spreader 416.

The heat spreader 416 may be stamped and fit within a generally rectangular outline. The heat spreader 416 may include for example, an aluminum material such as AL1100. The heat spreader 416 may include one or more flanges and/or bends 316 that form a cavity or a recessed area within the heat spreader 416 to receive and support the sensor PCB 402 (e.g., an outline or shape of the sensor PCB 402). In some instances, the one or more flange(s) and/or bend(s) 418 may align the sensor PCB 402 to the heat spreader 416 to improve thermal contact between features of the sensor PCB 402 and the heat spreader 416, thereby improving heat transfer (e.g., thermal conduction) between the sensor PCB 402 and the heat spreader 416. Furthermore, the one or more flange(s) and/or bend(s) 418 may improve thermal performance of the sensor PCB by providing additional surface area for conduction and/or convection of heat from the heat spreader 416.

In some instances, other features of a security camera may indirectly impact the sensor PCB thermal-control subsystem 112. For instance, a security camera may include an infrared light emitting diode (IRLED) board 318 and a cover 320 that impact heat flowing through the security camera. The cover 320 may include notches and/or other features to which flanges of the heat spreader 416 may connect (e.g., clip).

Figure 5:
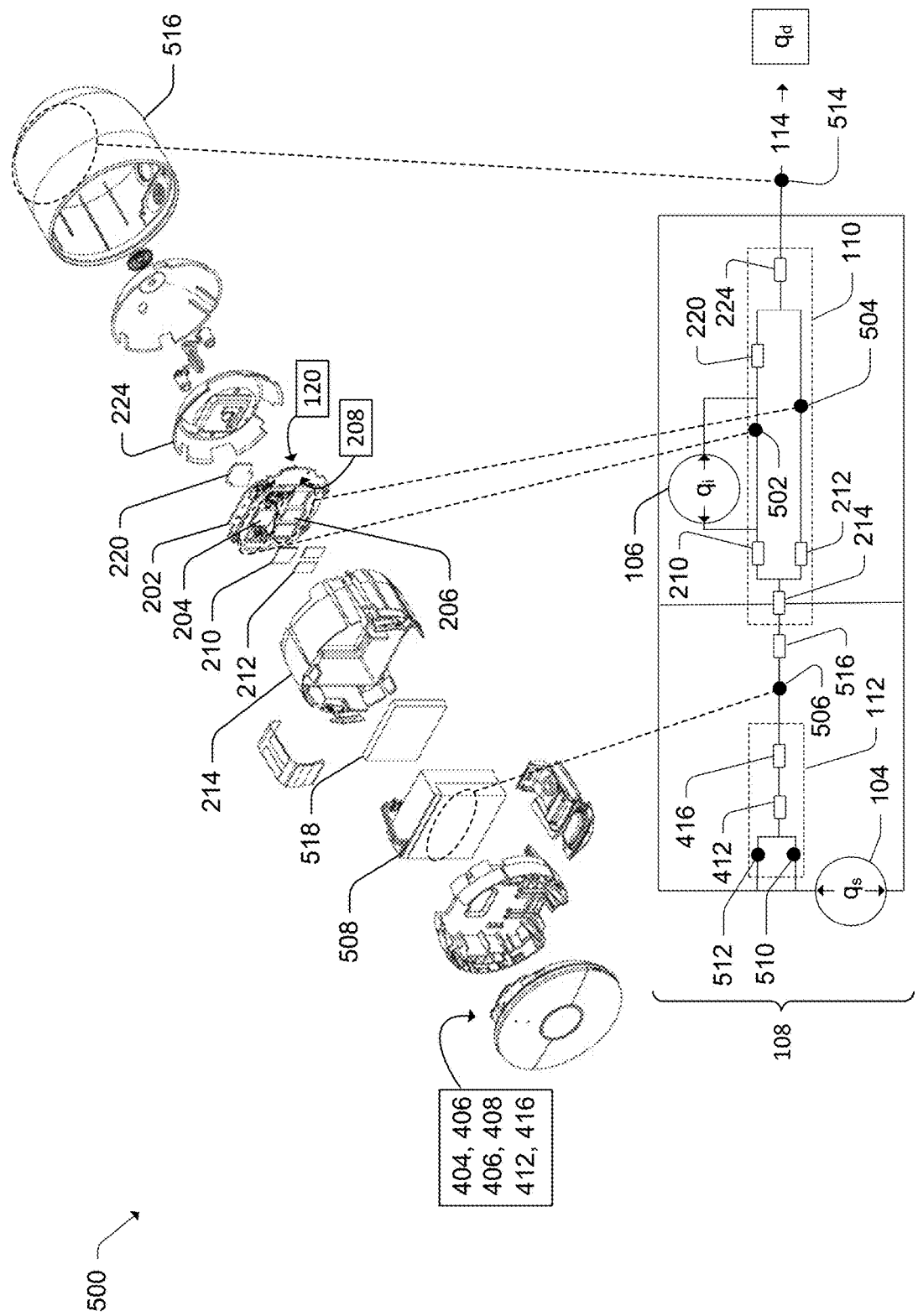
FIG. 5 illustrates example details of multiple thermal zones controlled by a thermal-control system of a security camera.

FIG. 5 illustrates example details 500 of multiple thermal zones controlled by the thermal-control system 108, including thermal zones controlled by the main PCB thermal-control subsystem 110 combined with the sensor PCB thermal-control subsystem 112.

The multiple thermal zones include a first thermal zone 502 having the SoC IC device 204. The SoC IC device 204 may execute machine-learning algorithms and process images while the security camera is in a CVR mode to generate a portion of an internal heat load.

The first thermal zone 502 may have a first prescribed temperature threshold corresponding to an allowable junction temperature of a diode within the SoC IC device 204 under the high thermal-loading condition (e.g., when both the solar heat load 104 and the internal heat load 106 are exuding heat upon a security camera such as the security camera 102 of FIG. 1).

As an example, the first prescribed temperature threshold may be approximately 100 degrees Celsius (° C.). In such an instance, the thermal-control system 108 may transfer and spread heat to maintain the first thermal zone 502 at or below the first prescribed temperature threshold (e.g., the junction temperature of a diode within the SoC IC device 204 may be maintained at or below 72° C. under the high thermal-loading condition).

The multiple thermal zones may also include a second thermal zone 504 that includes the one or more memory IC device(s) 206. Like the SoC IC device 204, the one or more memory IC device(s) 206 may be mounted to (and share) the first surface 208 of the main PCB 202.

The second thermal zone 504 may have a second prescribed temperature threshold corresponding to an allowable junction temperature of the memory IC device(s) 206. As an example, the second prescribed temperature threshold may be approximately 85° C. In such an instance, the thermal-control system 108 may concurrently transfer and spread heat to maintain the second thermal zone 504 at or below the second prescribed temperature threshold (e.g., the allowable junction temperature of the memory IC device(s) 206 may be maintained at or below 85° C. under the high thermal-loading condition).

A third thermal zone 506 that includes a battery 508 may also be part of the multiple thermal zones. The battery 508 may power the security camera 102 in the event another power source to the security camera 102 is interrupted.

The third thermal zone 506 may have a third prescribed temperature threshold corresponding to an allowable temperature of the battery 508. As an example, the third prescribed temperature threshold may be approximately 80° C. In such an instance, the thermal-control system 108 may concurrently transfer and spread heat to maintain the third thermal zone 506 at or below the third prescribed temperature threshold (e.g., the allowable temperature of the battery 508 may be maintained at or below 80° C. under the high thermal-loading condition).

The multiple thermal zones may also include a fourth thermal zone 510 that includes the image sensor IC device 404 (not visible in FIG. 5). The image sensor IC device 404 may be mounted to the first surface 408 of the sensor PCB 402 (not visible in FIG. 5).

The fourth thermal zone 510 may have a fourth prescribed temperature threshold corresponding to an allowable junction temperature of a diode within the image sensor IC device 404. As an example, the fourth prescribed temperature threshold may be approximately 85° C. In such an instance, the thermal-control system 108 may concurrently transfer and spread heat to maintain the fourth thermal zone 510 at or below the fourth prescribed temperature threshold (e.g., the junction temperature of the diode within the image sensor IC device 404 may be maintained at or below 85° C. under the high thermal-loading condition).

A fifth thermal zone 512 that includes the PIR sensor IC device 406 may be included in the multiple thermal zones. The PIR sensor IC device 406 may detect motion near a security camera and, like the image sensor IC device 404, be mounted to the first surface 408 of the sensor PCB 402.

The fifth thermal zone 512 may have a fifth prescribed temperature threshold corresponding to an allowable junction temperature of a diode within the PIR sensor IC device 406 (not visible in FIG. 1). As an example, the fifth prescribed temperature threshold may be approximately 80° C. In such an instance, the thermal-control system 108 may concurrently transfer and spread heat to maintain the fifth thermal zone 512 at or below the fifth prescribed temperature threshold (e.g., the junction temperature of a diode within the PIR sensor IC device 406 may be maintained at or below 80° C. under the high thermal-loading condition).

The multiple thermal zones also include a sixth thermal zone 514 that includes a housing component 516. The housing component 516 may house devices and subassemblies of a security camera (e.g., the security camera 102 of FIG. 1). The sixth thermal zone 514 may have a sixth prescribed temperature threshold corresponding to an allowable ergonomic touch temperature of the housing component 516. As an example, the sixth prescribed temperature threshold may be approximately 77° C. In such an instance, the thermal-control system 108 may concurrently transfer and spread heat to maintain the sixth thermal zone 514 at or below the sixth prescribed temperature threshold (e.g., the allowable ergonomic touch temperature of the housing component 516 may be maintained at or below 77° C. under the high thermal-loading condition).

The thermal-control system 108 may concurrently transfer and spread the heat (e.g., solar heat load 104, internal heat load 106 of FIG. 1) throughout a security camera (e.g., the security camera 102 of FIG. 1) using heat transfer modes that include conduction, convection, and/or radiation. The heat may subsequently be dissipated through exterior surfaces of the security camera (e.g., exterior surfaces of the housing component 516) to concurrently maintain temperatures of the six thermal zones (502, 504, 506, 510, 512, and 514) at or below respective prescribed temperature thresholds.

The thermal-control system 108 may include the main PCB thermal-control subsystem 110 having heat transfer mechanisms that contribute to transferring heat away from the SoC IC device 204. The main PCB thermal-control subsystem 110 may include the first TIM 210 (e.g., the SoC IC device topside TIM), the one or more second TIM(s) 212 (e.g., the memory IC device topside TIM(s)), and the first heat sink 214 (e.g., the front heat sink). The first heat sink 214 may be located between the battery 508 and the main PCB 202. The first TIM 210 may be located between, and serve as a thermal conduction path between, the SoC IC device 204 and the first heat sink 214. The second TIM(s) 212 may be located between, and serve as a thermal conduction path between, the first heat sink 214 and the memory IC device(s) 206.

The main PCB thermal-control subsystem 110 may also include the third TIM 220 (e.g., the SoC IC device backside TIM) and the second heat sink 224 (e.g., a rear heat sink). The third TIM 220 may be located between the second surface 222 of the main PCB 202 and the second heat sink 224. In some instances, the third TIM 220 may have a footprint that mirrors and approximates an outline of the SoC IC device 204.

The main PCB thermal-control subsystem 110 may include different combinations of materials. For example, the first TIM 210 and the second TIM(s) 212 may be made up of a gel material with a high thermal conductivity (measured in W/(m·K)) and include a silicone-rubber material injected with nanoparticles such as aluminum, beryllium-nitride, and so on. As another example, the third TIM 220 may include a thermal pad material. Examples of the thermal pad material include a preformed solid material that is silicone-based or paraffin wax-based.

The thermal-control system 108 may include the sensor PCB thermal-control subsystem 112 having heat transfer mechanisms that contribute to transferring heat away from the image sensor IC device 404 and/or the PIR sensor IC device 406. The sensor PCB thermal-control subsystem 112 may include the heat spreader 416 and the fourth TIM 412 of FIG. 4 (not visible in FIG. 5). The fourth TIM 412 may be located between the second surface 414 of the sensor PCB 402 and the heat spreader 416 and serve as a thermal conduction path between the second surface 414 of the sensor PCB 402 and the heat spreader 416.

The sensor PCB thermal-control subsystem 112 may include different combinations of materials. For example, the fourth TIM 412 may be made up of a gel material with a high thermal conductivity and include a silicone-rubber material injected with nanoparticles made of aluminum, beryllium-nitride, and so on.

The thermal-control system 108, including the main PCB thermal-control subsystem 110 and the sensor PCB thermal-control subsystem 112, is a passive thermal-control system. As implemented, the thermal-control system 108 does not require or use active or powered fans or pumps to concurrently maintain temperatures of the six thermal zones (502, 504, 506, 510, 512, and 514) at or below prescribed temperature thresholds.

In general, the main PCB thermal-control subsystem 110 may transfer a first quantity of heat to the housing component 516, and the sensor PCB thermal-control subsystem 112 may transfer a second quantity of heat to the housing component 516. Respective quantities of heat (e.g., the first quantity of heat and the second quantity of heat) may vary based on changing thermal loads and/or ambient conditions.

In certain instances, the first heat sink 214 may include a cavity that supports or houses a battery 508. In such an instance, the thermal-control system 108 may include a thermal foam material 518 having a low thermal conductivity to inhibit or prevent heat (e.g., heat from the SoC IC device 204) from transferring through the first heat sink 214 to the battery 508. Preventing heat transfer to the battery 508 may, in some instances, prevent the battery 508 from swelling and damaging the first heat sink 214.

Although techniques using and apparatuses for a thermal-control system of a security camera are described, it is to be understood that the subject of the appended claims is not necessarily limited to the specific features or methods described. Rather, the specific features and methods are disclosed as example ways in which a thermal-control system of a security camera can be implemented.

What is claimed is:

1. A thermal-control system for a security camera, the thermal-control system comprising:
   a first thermal-control subsystem, the first thermal-control subsystem configured to transfer a first quantity of heat to a housing, the first thermal-control subsystem including:
      a first thermal interface material, the first thermal interface material located between a system-on-chip integrated circuit device and a first heat sink, the system-on-chip integrated circuit device mounted to a first surface of a first printed circuit board;
      a second thermal interface material, the second thermal interface material located between a memory integrated circuit device and the first heat sink, the memory integrated circuit device mounted to the first surface of the first printed circuit board; and
      a third thermal interface material, the third thermal interface material located between a second surface of the first printed circuit board and a second heat sink, the second surface of the first printed circuit board opposite the first surface of the first printed circuit board; and
   a second thermal-control subsystem, the second thermal-control subsystem configured to transfer a second quantity of heat to the housing, the second thermal-control subsystem including:
      a fourth thermal interface material, the fourth thermal interface material located between a second surface of a second printed circuit board and a heat spreader, the second surface of the second printed circuit board opposite a first surface of the second printed circuit board to which a passive infrared sensor integrated circuit device and an image sensor integrated circuit device are mounted.

2. The thermal-control system of claim 1, wherein the first heat sink has a generally cylindrical shape, the second heat sink has a generally concave shape, and the heat spreader has a generally rectangular outline.

3. The thermal-control system of claim 1, wherein the first thermal interface material includes a silicone-rubber material injected with nanoparticles.

4. The thermal-control system of claim 1, wherein the first heat sink is a die-cast heatsink that includes an aluminum material.

5. The thermal-control system of claim 1, wherein the first heat sink includes a cavity that supports a battery.

6. The thermal-control system of claim 5, wherein an exterior surface of the first heat sink is in direct physical and thermal contact with an interior surface of the housing.

7. The thermal-control system of claim 1, further comprising a thermal foam material located between the first heat sink and a battery.

8. The thermal-control system of claim 1, wherein the third thermal interface material includes a thermal pad material.

9. The thermal-control system of claim 8, wherein the thermal pad material includes a paraffin wax-based material.

10. The thermal-control system of claim 8, wherein the thermal pad material includes a silicone material.

11. The thermal-control system of claim 1, wherein the second heat sink is a stamped heat sink that includes an aluminum-alloy material.

12. The thermal-control system of claim 1, wherein the fourth thermal interface material includes a gel material.

13. The thermal-control system of claim 12, wherein the gel material includes a silicone-rubber material injected with nanoparticles.

\* \* \* \* \*